United States Patent
Maemori et al.

(10) Patent No.: US 6,818,380 B2
(45) Date of Patent: Nov. 16, 2004

(54) METHOD FOR THE PREPARATION OF A SEMICONDUCTOR DEVICE

(75) Inventors: Satoshi Maemori, Sagamihara (JP); Kazufumi Sato, Sagamihara (JP); Kazuyuki Nitta, Ebina (JP); Katsumi Oomori, Chigasaki (JP); Kazuo Tani, Kanagawa-ken (JP); Yohei Kinoshita, Sagamihara (JP); Tomotaka Yamada, Atsugi (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/678,259

(22) Filed: Oct. 6, 2003

(65) Prior Publication Data

US 2004/0067615 A1 Apr. 8, 2004

Related U.S. Application Data

(62) Division of application No. 09/939,842, filed on Aug. 28, 2001.

(30) Foreign Application Priority Data

Aug. 31, 2000 (JP) ........................................ 2000-264528
Nov. 24, 2000 (JP) ........................................ 2000-357595

(51) Int. Cl.$^7$ .............................................. G03F 7/004
(52) U.S. Cl. ..................... 430/270.1; 430/311; 430/315
(58) Field of Search ............................. 430/270.1, 315, 430/311

(56) References Cited

U.S. PATENT DOCUMENTS

| | | | |
|---|---|---|---|
| 5,352,564 A | 10/1994 | Takeda et al. | |
| 5,492,793 A | 2/1996 | Breyta et al. | |
| 5,731,123 A | 3/1998 | Kawamura et al. | |
| 5,736,296 A | 4/1998 | Sato et al. | |
| 5,738,972 A | 4/1998 | Padmanaban et al. | |
| 5,759,739 A | 6/1998 | Takemura et al. | |
| 5,800,964 A | 9/1998 | Sato et al. | |
| 5,817,444 A | 10/1998 | Sato et al. | |
| 5,945,248 A | 8/1999 | Nitta et al. | |
| 5,945,517 A | 8/1999 | Nitta et al. | |
| 5,962,184 A | 10/1999 | Allen et al. | |
| 6,060,213 A | 5/2000 | Kodama | |
| 6,245,930 B1 | 6/2001 | Oomori et al. | |
| 6,255,041 B1 | 7/2001 | Oomori et al. | |
| 6,274,289 B1 | 8/2001 | Subramanian et al. | |
| 6,395,446 B1 | 5/2002 | Seki et al. | |
| 6,623,907 B2 * | 9/2003 | Numata et al. | 430/270.1 |
| 2003/0129531 A1 * | 7/2003 | Oberlander et al. | 430/271.1 |
| 2004/0002017 A1 * | 1/2004 | Adams et al. | 430/270.1 |
| 2004/0023147 A1 * | 2/2004 | Hirano et al. | 430/191 |
| 2004/0033438 A1 * | 2/2004 | Hamada et al. | 430/270.1 |

FOREIGN PATENT DOCUMENTS

| | | |
|---|---|---|
| JP | 2000-75488 | 3/2000 |
| JP | 2000-122293 | 4/2000 |
| JP | 2001-166478 A | 6/2001 |

* cited by examiner

*Primary Examiner*—Amanda Walke
(74) *Attorney, Agent, or Firm*—Wenderoth, Lind & Ponack, LLP

(57) ABSTRACT

The invention discloses an improvement in the photolithographic patterning process of a photoresist layer in the manufacture of semiconductor devices in which occurrence of defects in the patterned resist layer can be greatly suppressed resulting in increased reliability of the semiconductor devices and productivity thereof. The improvement can be accomplished by using a chemical-amplification positive-working photoresist composition which exhibits a rate of film thickness reduction in the range from 0.09 to 1.0 nm/second when the photoresist layer before light-exposure is kept in a 2.38% aqueous solution of tetramethylammonium hydroxide at 23° C. to dissolve away the resist layer.

7 Claims, No Drawings

US 6,818,380 B2

METHOD FOR THE PREPARATION OF A SEMICONDUCTOR DEVICE

This is a divisional of Ser. No. 09/939,842, filed Aug. 28, 2001.

BACKGROUND OF THE INVENTION

The present invention relates to a method for the preparation of a semiconductor device or, more particularly, to a high-yield method for the preparation of a semiconductor device of high reliability by decreasing the number of defects occurring in the process of photolithographic patterning of a photoresist layer.

As a trend in recent years, the requirement for a higher degree of integration in semiconductor devices is increasing year by year and mass production of LSIs having a fineness of the design rule of about 0.20 μm has now left the starting point and the schedule for the mass production of LSIs having fineness of the design rule of about 0.15 μm is rapidly approaching its starting point.

In connection with this trend toward greatly increased fineness of patterning in the manufacture of semiconductor devices, upgrading of the photoresist compositions, which are pattern-wise exposed to KrF excimer laser beams, is now required to comply with the 0.12 to 0.18 μm fineness of patterning for line-and-space patterns, hole patterns and isolated patterns.

Along with the above mentioned trend toward increased fineness of patterning of photoresist layers, on the other hand, another important problem to be solved is the number of defects occurring in the patterned resist layer after development, which was not taken as so serious heretofore. Namely, high-yield mass production of semiconductor devices having high electric reliability can be accomplished only by greatly decreasing the number of defects occurring in the photoresist layer.

The defects here implied include any of the defects found in the patterned resist layer such as adherence of scums, disordered patterning of the resist layer and others, which can be detected by inspecting the patterned resist layer after development just from above on a surface-defect inspection instrument such as the instrument Model KLA manufactured by KLA Tencole Co.

SUMMARY OF THE INVENTION

Under the above described circumstances, the present invention has an object to provide a method for the production of semiconductor devices of high electrical reliability in a high yield by greatly suppressing occurrence of defects in the patterned resist layer which was not taken as so serious heretofore from the standpoint of quality control.

Thus, the present invention provides an improvement in a method for the preparation of a semiconductor device by forming a patterned resist layer on the surface of a substrate by pattern-wise light-exposure of a photoresist layer of a chemical-amplification positive-working photoresist composition comprising (A) a compound capable of generating an acid by irradiation with actinic rays and (B) a resinous compound capable of being imparted with increased solubility in an aqueous alkaline solution in the presence of an acid, which improvement comprises decreasing the number of defects in the patterned resist layer by selecting the photoresist composition of which the photoresist layer before the pattern-wise light-exposure exhibits reduction of thickness at 23° C. in an aqueous alkaline solution at a rate in the range from 0.09 to 1.0 nm/second.

DETAILED DESCRIPTION OF THE PREFERRED EMBODIMENTS

As is understood from the above given description, the unexpected discovery leading to the most characteristic feature of the invention is that the number of defects in the patterned photoresist layer obtained by development after pattern-wise light-exposure of a photoresist layer in the photolithographic process for the manufacture of semiconductor devices can be greatly decreased when the photoresist layer before the pattern-wise light-exposure exhibits reduction of the thickness in an aqueous alkaline solution at a specified rate.

The photoresist composition to which the present invention is applicable is a chemical-amplification positive-working photoresist composition comprising, as the essential ingredients, the above described components (A) and (B). It is essential in the present invention that the types and compounding proportion of these ingredients should be so selected that the photoresist layer of the composition before light-exposure exhibits a rate of film thickness reduction specified above in an aqueous alkaline solution which is a 2.38% by weight aqueous solution of tetramethylammonium hydroxide.

The component (A) comprised in the photoresist composition used in the present invention is a compound capable of generating an acid when irradiated with actinic rays. The component (A) is not particularly limitative and can be selected from those radiation-sensitive acid-generating compounds formulated in conventional chemical-amplification photoresist compositions. Examples of suitable radiation-sensitive acid-generating compounds include diazomethane compounds, nitrobenzyl compounds, sulfonic acid esters, onium salt compounds, benzoin tosylate compounds, halogen-containing triazine compounds, cyano group-containing oximesulfonate compounds and the like, of which diazomethane compounds and onium salt compounds having a $C_1$–$C_{15}$ halogenoalkyl sulfonic acid as the anionic moiety are preferable.

Examples of the diazomethane compounds include bis(p-toluenesulfonyl)diazomethane, bis(1,1-dimethylethylsulfonyl)diazomethane, bis(cyclohexylsulfonyl)diazomethane and bis(2,4-dimethylphenylsulfonyl)diazomethane.

Examples of the above specified onium salt compounds include diphenyliodonium trifluoromethanesulfonate, bis(4-methoxyphenyl)iodonium trifluoromethanesulfonate, bis(p-tert-butylphenyl)iodonium trifluoromethanesulfonate, triphenylsulfonium trifluoromethanesulfonate, (4-methoxyphenyl)diphenylsulfonium trifluoromethanesulfonate and (p-tert-butylphenyl)diphenylsulfonium trifluoromethanesulfonate as well as those substituted by nonafluorobutanesulfonate for the trifluoromethanesulfonate in the above named onium salt compounds.

It is optional in the present invention that the above named various radiation-sensitive acid-generating compounds are used singly or as a combination of two kinds or more. The amount of the radiation-sensitive acid-generating agent as the component (A) in the photoresist composition used in the invention is in the range from 1 to 20 parts by weight per 100 parts by weight of the resinous compound as the component (B). When the amount of the component (A) is too small, formation of a patterned latent image can hardly be accomplished by the pattern-wise light-exposure. When the amount of the component (A) is too large, on the other hand, the photoresist composition in the form of a uniform solution can be obtained only with difficulties or, even if it ever be obtained, the solution suffers a decrease in the storage stability.

It is desirable that the acid-generating agent as the component (A) is selected by taking into consideration the acid-dissociability of the acid-dissociable solubility-reducing groups substituting on the resinous ingredient as the component (B). When the acid-dissociability of the acid-dissociable substituent groups is low as in the resinous compounds belonging to the class (B-2) described later, for example, the component (A) should preferably be selected from those releasing an acid of high acid strength such as the onium salt compounds or, in particular, iodonium salt compounds and sulfonium salt compounds having a fluoroalkyl sulfonic acid ion as the anionic counterpart. When the substituent groups have high acid-dissociability as is the case with ($B_2$) in the class (B-1) resinous compounds described later, on the other hand, the component (A) is preferably a diazomethane compound.

The component (B) comprised in the photoresist composition used in the invention is a resinous compound capable of being imparted with increased solubility in an aqueous alkaline solution in the presence of an acid or when interacted by an acid. Suitable resinous compounds to meet the requirement for the component (B) can be classified into two classes of (B-1) and (B-2) described below.

The resinous compound as the component (B) belonging to the class (B-1) is a copolymeric resin consisting of hydroxystyrene or α-methyl hydroxystyrene units substituted for the hydroxyl hydrogen atoms by acid-dissociable solubility-reducing groups and unsubstituted hydroxystyrene or α-methyl hydroxystyrene units. The above mentioned acid-dissociable solubility-reducing substituent groups are subject to dissociation by interaction with an acid released from the component (A) to regenerate phenolic hydroxyl groups so that the resinous compound which is alkali-insoluble before light-exposure of the photoresist layer is imparted with increased solubility in an aqueous alkaline solution.

With respect to the position of the phenolic hydroxyl group on the styrenic benzene ring in the unsubstituted or substituted (α-methyl) hydroxystyrene units, the hydroxyl group can be at any of the o-, m- and p-positions relative to the carbon atom in the main chain structure of the copolymer, of which the p-position is preferable in respect of good availability of the compounds. The phenolic hydroxyl groups in the copolymeric resin contribute to the alkali-solubility of the resin and to the adhesive bonding of the photoresist layer to the substrate surface.

The acid-dissociable solubility-reducing substituent group substituting for the hydroxyl hydrogen atom in the copolymeric resin is not particularly limitative and can be selected from those used in conventional chemical-amplification photoresist compositions including tertiary alkyl groups, tertiary alkyloxycarbonyl groups, tertiary alkyloxycarbonylalkyl groups, cyclic ether groups and alkoxyalkyl groups.

Examples of the above mentioned tertiary alkyloxycarbonyl groups include tert-butyloxycarbonyl group and tert-amyloxycarbonyl group. Examples of the above mentioned tertiary alkyloxycarbonylalkyl groups include tert-butyloxycarbonylmethyl group, tert-butyloxycarbonylethyl group, tert-amyloxycarbonylmethyl group and tert-amyloxycarbonylethyl group. Examples of the above mentioned tertiary alkyl groups include tert-butyl group and tert-amyl group. Examples of the above mentioned cyclic ether groups include tetrahydropyranyl group and tetrahydrofuranyl group. Examples of the above mentioned alkoxyalkyl groups include 1-ethoxyethyl group and 1-methoxypropyl group.

A typical example of the resinous compound as the component (B) belonging to the class (B-1) is a polyhydroxystyrene having a weight-average molecular weight in the range from 3000 to 30000 with a molecular weight dispersion of 1 to 6.0, of which from 10 to 60% of the hydroxyl hydrogen atoms are substituted by acid-dissociable solubility-reducing groups selected from tert-butyloxycarbonyl, tert-butyloxycarbonylmethyl, tert-butyl, tetrahydropyranyl, tetrahydrofuranyl, 1-ethoxyethyl and 1-methylpropyl groups.

The resinous compounds as the component (B) belonging to the class (B-1) is preferably a combination of two different resins ($B_1$) and ($B_2$) in a proportion of 10:90 to 90:10 by weight, of which the resinous compound ($B_1$) is a polyhydroxystyrene having a weight-average molecular weight of 3000 to 30000 with a molecular weight dispersion of 1 to 6.0 and containing tert-butyloxycarbonyl groups or tetrahydropyranyl groups substituting for 10 to 50% of the hydroxyl hydrogen atoms and the resinous compound ($B_2$) is a polyhydroxystyrene having a weight-average molecular weight of 3000 to 30000 with a molecular weight dispersion of 1 to 6.0 and containing alkoxyalkyl groups such as 1-ethoxyethyl groups substituting for 10 to 50% of the hydroxyl hydrogen atoms. The particular preference for a combination of these resinous compounds is based on the discovery that the requirement for the rate of film thickness reduction of the photoresist layer in an aqueous alkaline solution in the range from 0.09 to 1.0 nm/second can be complied with relatively easily by using a mixture of these two resinous compound exhibiting a rate of film thickness reduction in the range from 0.10 to 1.0 nm/second at 23° C. in a 2.38% by weight aqueous solution of tetramethylammonium hydroxide.

An alternative preference for the resinous compound as the component (B) is given by a 10:90 to 90:10 by weight combination of the above described resinous compound ($B_2$) and a third resinous compound which is a polyhydroxystyrene having a weight-average molecular weight of 3000 to 30000 with a molecular weight dispersion of 1 to 6.0 and containing tetrahydropyranyl groups substituting for 10 to 50% of the hydroxyl hydrogen atoms by the same reasons as above.

It is optional that, besides the above described monomeric units derived from unsubstituted and substituted hydroxystyrenes, the resinous compound as the component (B-1) further comprises monomeric units of other types derived from different comonomers such as hydroxystyrene derivatives and (meth)acrylic acid derivatives used in the preparation of the resinous ingredient formulated in conventional chemical-amplification photoresist compositions for exposure with KrF or ArF excimer laser beams, though in a limited molar fraction.

Other types of the resinous compounds usable as the component (B) and capable of being imparted with an increase in a solubility in an aqueous alkaline solution include (B-2) copolymers consisting of (meth)acrylic acid units substituted by acid-dissociable groups such as tertiary alkyl groups for the carboxyl hydrogen atoms and (α-methyl)hydroxystyrene units, optionally, in combination with styrene units and the like.

The monomeric units constituting the copolymer as the component (B-2) include, as a class, (meth)acrylic acid units substituted by tertiary alkyl groups as the acid-dissociable solubility-reducing groups for the carboxyl hydrogen atoms. When the photoresist layer of the composition is patternwise exposed to a radiation, the tertiary alkyl groups are dissociated in the exposed areas by interaction with the acid generated from the component (A) so that the resinous ingredient which is alkali-insoluble before light-exposure is rendered alkali-soluble by exposure to light as a result of conversion of the ester group into a free carboxyl group.

The monomeric units of the other class comprised in the copolymer (B-2) are (α-methyl) hydroxystyrene units in which the position of the hydroxyl group on the benzene ring is not limited to one of o-, m- and p-positions although p-hydroxystyrene units are preferred in respect of good availability and low cost of the monomeric compound therefor. These monomeric units serve to improve alkali-solubility of the resist layer and adherent bonding of the resist layer to the substrate surface along with an improvement in the etching resistance of the resist layer.

The tertiary alkyl group mentioned above is exemplified by those having three chain-like alkyl groups bonded to the tertiary carbon atom such as tert-butyl and tert-amyl groups and those alkyl-substituted monocyclic or polycyclic hydrocarbon groups of which two of the alkyl groups bonded to the tertiary carbon atom jointly form a cyclic structure such as 1-methylcyclohexyl, 1-ethylcyclohexyl, 1-propylcyclohexyl, 2-methyladamantyl, 2-ethladamantyl and 2-propyladamantyl groups. The alkyl group in the above mentioned mono-or polycyclic hydrocarbon groups is preferably a lower alkyl group such as methyl, ethyl and propyl groups.

Among the above mentioned tertiary alkyl groups, alkyl-substituted monocyclic and polycyclic hydrocarbon groups are preferred and 1-alkylcycloalkyl and 2-alkyladamantyl groups are more preferable in respect of high contrast of patterning and excellent etching resistance of the resist layer.

Though optional, the copolymeric resin as the component (B-2) may further comprise monomeric units to impart alkali-insolubility to the resin such as the units derived from styrene, α-methylstyrene and α-ethylstyrene. Introduction of these monomeric units to the copolymer is advantageous in respect of delicate controllability of the balance between alkali-solubility in the exposed areas and alkali-insolubility in the unexposed areas of the resist layer so as to give an excellent cross sectional profile of the patterned resist layer.

It is further optional that the copolymer as the component (B-2) comprises at least two monomeric units derived from (meth)acrylic acid substituted for each of the carboxyl hydrogen atoms by an acid-dissociable crosslinkable group. Introduction of such crosslinkable units to the copolymer is desirable because an improvement is expected thereby in the resistance of the resist layer against dry etching as compared with a resin not containing such units even when the thickness of the resist layer is so decreased as to be 500 nm or smaller in compliance with the recent trend along with a great improvement in the patterning contrast and pattern resolution expected as an inherency of crosslinkable groups. This advantage is particularly remarkable in the formation of a contact hole pattern in which excellent pattern resolution and orthogonality of the cross sectional profile of the resist layer are essential as compared with other types of resist patterns such as isolated line patterns and line-and-space patterns.

An example of the particularly preferable resinous compound as the component (B-2) is a quaternary copolymer consisting of four types of monomeric units including the units of the first type (b1) represented by the general formula:

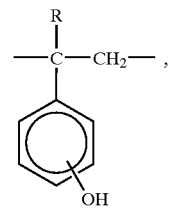

in which R is a hydrogen atom or a methyl group; the units of the second type (b2) represented by the general formula:

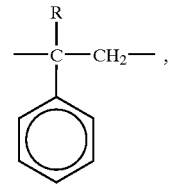

in which R has the same meaning as defined above; the units of the third type (b3) represented by the general formula:

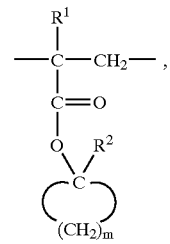

in which $R^1$ is a hydrogen atom or a methyl group, $R^2$ is an alkyl group having 1 to 5 carbon atoms and the subscript m is a positive integer in the range from 3 to 7; and the units of the fourth type (b4) represented by the general formula:

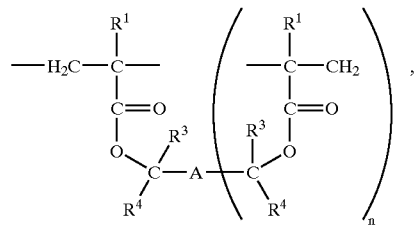

in which $R^1$ has the same meaning as defined above, $R^3$ and $R^4$ are each a lower alkyl group having 1 to 5 carbon atoms, the subscript n is 1, 2 or 3 and A is a single bond or an organic residue of (n+1) valency. A photoresist composition formulated with such a copolymeric resin is advantageous in respect of good pattern resolution an high etching resistance as well as excellent orthogonality of the cross sectional profile of a patterned resist layer.

The monomeric units (b1) in the copolymeric resin serve to impart alkali-solubility to the composition and adhesive bonding strength to the substrate surface or etching resistance to the resist layer. The monomeric units (b2) serve to impart alkali-insolubility and etching resistance to the resist layer.

The monomeric unit (b3) is a unit having an acid-dissociable solubility-reducing group such as a tertiary alkyl group which is dissociated by interacting with the acid generated in the light-exposed areas from the component (A) so that the ester linkage is converted into a carboxyl group to render the resist layer, which is alkali-insoluble before light-exposure, alkali-soluble. The ester-forming group in this monomeric unit of the copolymeric resin in the composition in the unexposed areas is a monocycloalkyl group formed by cyclizing bonding of two of the alkyl groups in a tertiary alkyl group so that the photoresist composition is advantageous in respect of high patterning contrast and excellent etching resistance of the resist layer as compared with conventional photoresist compositions in which the ester-forming acid-dissociable group is tert-butyl group. The monocycloalkyl group is exemplified by cyclobutyl, cyclopentyl, cyclohexyl, cycloheptyl and cyclooctyl groups, of which cyclopentyl and cyclohexyl groups are preferable in respect of high pattern resolution and large focusing depth latitude.

The alkyl group denoted by $R^2$ in the general formula for the monomeric units (b3) is preferably an alkyl group having at least two carbon atoms such as ethyl and propyl groups in respect of the acid-dissociability, of which ethyl group is more preferable.

The monomeric unit of the fourth type (b4) is a crosslinking unit formed by conjoining of at least two molecules of a (meth)acrylic acid ester at one alkyl group bonded to the respective tertiary carbon atoms through an organic residue A, in which the ester group is, like the monomeric units (b3), converted into a carboxyl group by interaction with the acid generated in the light-exposed areas from the component (A) so as to render the copolymeric resin alkali-soluble. On the other hand, the crosslinking groups are left intact in the unexposed areas so that the copolymeric resin remains alkali-insoluble. Accordingly, the patterned resist layer obtained by an alkali-development treatment has high contrast of patterning and excellent resistance against etching.

The lower alkyl group denoted by $R^3$ or $R^4$ in the general formula for the monomeric units (b4) is exemplified by methyl, ethyl, n-propyl, isopropyl, n-butyl, isobutyl, tert-butyl and n-pentyl groups. The symbol A in the general formula denotes a single bond or an (n+1)-valent organic residue or, preferably, a hydrocarbon residue having 1 to 20 carbon atoms. When n is 1, the hydrocarbon residue is exemplified by divalent hydrocarbon groups such as straight-chain and branched-chain alkylene groups, cycloalkylene groups and arylene groups. When n is 2, the hydrocarbon residue is a tervalent group obtained by removing a hydrogen atom from one of the above mentioned divalent hydrocarbon groups. When n is 3, the hydrocarbon residue is a quadrivalent group obtained by removing two hydrogen atoms from one of the above mentioned divalent hydrocarbon groups. It is particularly preferable that, in the monomeric units (b4), the organic residue A is a straightly linear alkylene group having 2 to 10 carbon atoms and $R^3$ and $R^4$ are each a methyl group.

The crosslinking monomeric unit (b4) is derived, for example, from a di-, tri- or tetraester compound having 2, 3 or 4 ethylenically unsaturated groups obtained by the condensation reaction of one mole of a di-, tri- or tetrol compound having a tertiary carbon atom adjacent to the hydroxyl group with 2 to 4 moles of (meth)acrylic acid or a reactive functional derivative thereof, e.g., acid halide.

The above mentioned diol compound is exemplified by glycol compounds such as 2,3-dimethyl-2,3-butanediol, 2,3-diethyl-2,3-butanediol, 2,3-di-n-propyl-2,3-butanediol, 2,4-dimethyl-2,4-pentanediol, 2,4-diethyl-2,4-pentanediol, 2,4-di-n-propyl-2,4-pentanediol, 2,5-dimethyl-2,5-hexanediol, 2,5-diethyl-2,5-hexanediol, 2,5-di-n-propyl-2,5-hexanediol, 2,6-dimethyl-2,6-heptanediol, 2,6-diethyl-2,6-heptanediol and 2,6-di-n-propyl-2,6-heptanediol. The triol compound is exemplified by 2,4-dimethyl-2,4-dihydroxy-3-(2-hydroxypropyl)pentane, 2,4-diethyl-2,4-dihydroxy-3-(2-hydroxypropyl)pentane, 2,5-dimethyl-2,5-dihydroxy-3-(2-hydroxypropyl)hexane and 2,5-diethyl-2,5-dihydroxy-3-(2-hydroxypropyl)hexane. The tetrol compound is exemplified by erythritol, pentaerythritol and 2,3,4,5-hexanetetrol.

Among the diester and triester compounds, from which the crosslinking monomeric units (b4) are derived, examples of particularly preferable compounds include those represented by the general formulas:

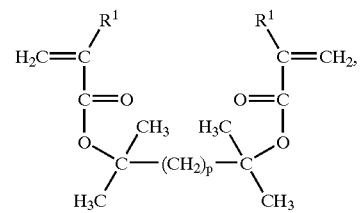

in which $R^1$ has the same meaning as defined before and the subscript p is 0, 1 or 2,

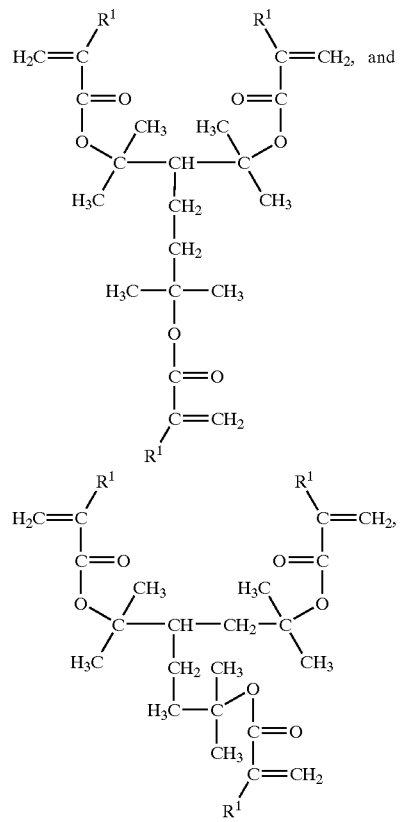

in which $R^1$ has the same meaning as defined before.

As to the molar fractions of the monomeric units (b1) to (b4) in the copolymeric resin, it is preferable that, though not very critical, the copolymer consists of from 50 to 80% or, more preferably, from 65 to 80% of the units (b1), from 1 to 25% or, more preferably, from 5 to 20% of the units (b2), from 3 to 25% or, more preferably, from 5 to 20% of the units (b3) and from 1 to 15% or, more preferably, from 3 to 10% of the units (b4).

Besides the above mentioned monomeric units of the types (b1) to (b4), it is optional that the copolymeric resin further comprises, in limited molar fractions, monomeric units of different types employed or proposed as the units of (meth)acrylic acid derivatives in a conventional positive-working photoresist compositions for patterning exposure with KrF or ArF excimer laser beams.

It is preferable that the copolymeric resin has a weight-average molecular weight in the range from 10000 to 30000.

In the positive-working photoresist composition used in the method according to the present invention, the number of defects in the resist layer can be remarkably decreased when the composition is so adjusted that the rate of film thickness reduction of the resist layer before light-exposure in an alkaline solution is in the range from 0.09 to 1.0 nm/second at 23° C. When this rate is too small, the number of the defects is increased while the number of the defects is gradually increased by increasing the rate to exceed the upper limit not to accomplish patterning of the resist layer in high quality. Preferably, the rate of film thickness reduction should be in the range from 0.09 to 0.7 nm/second in order to accomplish a high defect-suppressing effect and to obtain high pattern resolution and excellent cross sectional profile of the patterned resist layer.

For a positive-working photoresist composition formulated with the component (B-1), in particular, it is preferable that the rate of film thickness reduction is selected in the range from 0.01 to 0.5 nm/second or, more preferably, from 0.15 to 0.20 nm/second. For a positive-working photoresist composition formulated with the component (B-2), the rate should be selected in the range from 0.09 to 0.35 nm/second.

Though optional, the positive-working photoresist composition used in the inventive method is compounded with (C) an aliphatic tertiary amine compound and/or (D) a carboxylic acid or a phosphorus-containing oxoacid compound or a derivative thereof. The above mentioned amine compound as the component (C) has an effect of improving the holding stability of the latent images formed by pattern-wise light exposure and preventing excessive diffusion of the acid generated from the acid-generating agent by light-exposure. The above-mentioned acid compound as the component (D) has an effect of increasing the photosensitivity of the composition and decreasing the substrate-dependency of the resist layer.

Examples of the aliphatic tertiary amine compound as the component (C) include triethylamine, tri-n-propylamine, methyl diethyl amine, dimethyl ethyl amine, triisopropylamine, tri-n-butylamine, triisobutylamine, tri-n-pentylamine, triethanolamine and tributanolamine. These amine compounds can be used either singly or as a combination of two kinds or more. The amount of the amine compound in the photoresist composition is, when used, in the range from 0.01 to 1.0 part by weight per 100 parts by weight of the resinous ingredient as the component (B).

Examples of the carboxylic acid compound as the component (D) include saturated and unsaturated aliphatic carboxylic acids, alicyclic carboxylic acids, oxycarboxylic acids, alkoxycarboxylic acids, ketocarboxylic acids and aromatic carboxylic acids exemplified by acetic acid, propionic acid, butyric acid, lactic acid, succinic acid, maleic acid, malonic acid, lauric acid, 1,1-cyclohexane dicarboxylic acid, benzoic acid, 4-hydroxybenzoic acid, 2-hydroxybenzoic acid, i.e. salicylic acid, 2,5-, 2,6-, 3,4- and 3,5-dihydroxybenzoic acids, 2- and 4-vinyl benzoic acids, phthalic acid, terephthalic acid and isophthalic acid.

The phosphorus-containing oxoacids or a derivative thereof as the above mentioned component (D) are exemplified by phosphoric acid and esters thereof, e.g., di-n-butyl and diphenyl phosphates, phosphonic acid and esters thereof, e.g., dimethyl, di-n-butyl, phenyl, diphenyl and dibenzyl phosphonates and phosphinic acid and esters thereof, e.g., phenyl phosphinate.

It is preferable that the component (D), when used, is salicylic acid or phenylphosphonic acid. The amount of the component (D), when used, in the photoresist composition is in the range from 0.01 to 1.0 part by weight or, preferably, from 0.1 to 0.5 part by weight per 100 parts by weight of the resinous ingredient as the component (B). When the amount of the component (D) is too small, formation of a non-orthogonal trapezoidal or skirt-trailing cross sectional profile of the patterned resist layer cannot be fully prevented while, when the amount thereof is too large, an unduly large rate of film thickness reduction results.

In addition to the above described components (A), (B), (C) and (D), the chemical-amplification positive-working photoresist composition used in the inventive method can optionally be admixed with a variety of known additives such as halation inhibitors, surface active agents for prevention of striation and others.

As is mentioned before, the scope of the inventive method consists in that the chemical-amplification positive-working photoresist composition is formulated in such a manner that the resist layer before light-exposure exhibits a dissolving rate in alkali or, namely, a rate of film thickness reduction in an aqueous alkaline medium in the range from 0.09 to 1.0 nm/second by adequately selecting the respective ingredients and compounding proportion thereof. The rate of film thickness reduction implied here means the decreased amount of film thickness of the resist layer before light-exposure by dissolving away per unit time when the resist layer is immersed and kept in a 2.38% by weight aqueous solution of tetramethylammonium hydroxide at 23° C.

The rate of film thickness reduction of the resist layer as a key parameter of the inventive method can be controlled mainly by adequately selecting the radiation-sensitive acid-generating compound as the component (A) and the resinous ingredient as the component (B) capable of being imparted with increased solubility in an aqueous alkaline solution in the presence of an acid as well as the compounding proportion of these ingredients. Since the component (B) has the largest influence on the rate of film thickness reduction in alkali of the resist layer, it is important that the resinous ingredient as the component (B) per se exhibits a rate of film thickness reduction of the resin layer in alkali in the range from 0.09 to 1.0 nm/second.

It is usual that the chemical-amplification positive-working photoresist composition comprising the above described components (A) to (D) is employed in the inventive method in the form of a uniform photoresist solution prepared by dissolving the respective ingredients in an organic solvent. Examples of suitable organic solvents include ketones such as acetone, methyl ethyl ketone, cyclohexanone, methyl isoamyl ketone and 2-heptanone, polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof, cyclic ethers such as dioxane and esters such as methyl lactate, ethyl lactate, methyl acetate, ethyl acetate, butyl acetate, methyl pyruvate, ethyl pyruvate, methyl methoxypropionate and ethyl ethoxypropionate. These organic solvents can be used either singly or as a mixture of two kinds or more.

When the process of photolithographic patterning is conducted according to a known procedure but by using a chemical-amplification positive-working photoresist composition of which the resist layer before light-exposure exhibits a rate of film thickness reduction in alkali in the range from 0.09 to 1.0 nm/second, an unexpectedly great advantage can be obtained that the number of defects on the resist layer can be remarkably decreased so that semiconductor devices of high electric reliability can be produced in a high yield. The photolithographic patterning process in the inventive method can be performed according to a conventional procedure comprising the steps of formation of a photoresist layer on a substrate surface, pattern-wise light-exposure of the photoresist layer, post-exposure baking treatment and development treatment.

It is preferable when the component (B) in the photoresist composition is the resinous compound (B-1) that the photoresist layer is subjected to a prebaking treatment and post-exposure baking treatment each at 90 to 110° C. before and after, respectively, the pattern-wise light-exposure. When the component (B) is the resinous compound (B-2), on the other hand, the prebaking treatment and the post-exposure baking treatment should be conducted each at a temperature of 120 to 150° C. or, preferably, 130 to 140° C.

The method of the present invention for the preparation of a semiconductor device is most satisfactorily applicable to the manufacture of semiconductor devices having a contact hole pattern in the resist layer.

In the following, the present invention is described in more detail by way of Examples, in which evaluation of the photoresist compositions was undertaken for the following items (1) to (4) by the respective testing procedures described there.

(1) Photosensitivity

A semiconductor silicon wafer was coated uniformly with the photoresist solution under testing by using a spinner followed by heating on a hot plate at 90° C. for 90 seconds to give a dried photoresist layer having a thickness of 0.7 $\mu$m. The thus formed photoresist layer was pattern-wise exposed to excimer laser beams on a minifying projection exposure machine (Model NSR-2005EX8A, manufactured by Nikon Co.) by stepwise increasing the exposure dose with 1 mJ/cm$^2$ increments followed by a post-exposure baking treatment at 110° C. for 90 seconds. Thereafter, the photoresist layer was subjected to a development treatment with a 2.38% by weight aqueous solution of tetramethylammonium hydroxide at 23° C. for 60 seconds followed by rinse with water for 30 seconds and drying to give a patterned resist layer of which the minimum exposure dose in mJ/cm$^2$ unit resulting in complete removal of the photoresist layer by the development treatment was determined and recorded as the photosensitivity of the photoresist composition.

(2) Cross Sectional Profile of Patterned Resist Layer

A line-and-space patterned resist layer of 0.2 $\mu$m line width was formed in the same manner as in (1) described above and the cross sectional profile of the line-patterned resist layer was examined on a scanning electron microscopic photograph to record the results in three ratings of: A for a profile of good orthogonality; B for a trapezoidal profile; and C for a profile with rounded shoulders and trailing skirts.

(3) Pattern Resolution

Recording was made for the critical resolution in the line-and-space patterned resist layer formed in the same manner as in (1) described above.

(4) Number of Defects

Number of the defects was counted on a silicon wafer substrate processed in the same manner as in (1) above by using a surface-defect inspection instrument (Model KLA, manufactured by KLA Co.).

EXAMPLE 1

A positive-working photoresist solution was prepared by uniformly dissolving, in 500 parts by weight of propyleneglycol monomethyl ether acetate, 30 parts by weight of a first polyhydroxystyrene resin having a weight-average molecular weight of 8000 with a molecular weight dispersion of 1.3 and substituted by tert-butoxycarbonyl groups for 35% of the hydroxyl hydrogen atoms and 70 parts by weight of a second polyhydroxystyrene resin having a weight-average molecular weight of 8000 with a molecular weight dispersion of 1.3 and substituted by 1-ethoxyethyl groups for 35% of the hydroxyl hydrogen atoms and then 7 parts by weight of bis(cyclohexylsulfonyl) diazomethane, 0.1 part by weight of triethylamine and 0.5 part by weight of salicylic acid followed by filtration of the solution through a membrane filter of 0.2 $\mu$m pore diameter. Films of the above mentioned first and second polyhydroxystyrene resins exhibited rates of film thickness reduction of 0.33 nm/second and 0.35 nm/second, respectively, in a 2.38% by weight aqueous solution of tetramethylammonium hydroxide at 23° C.

A semiconductor silicon wafer was uniformly coated with this photoresist solution followed by drying to form a dried photoresist layer having a thickness of 0.7 $\mu$m which exhibited a rate of film thickness reduction of 0.15 nm/second in a 2.38% by weight aqueous solution of tetramethylammonium hydroxide at 23° C. The results of the evaluation tests undertaken for this photoresist composition are shown in Table 1 below.

EXAMPLE 2

A positive-working photoresist solution was prepared in the same formulation as in Example 1 excepting for the replacement of the first polyhydroxystyrene resin used in Example 1 with the same amount of a third polyhydroxystyrene resin having a weight-average molecular weight of 8000 with a molecular weight dispersion of 1.3 and substituted by tetrahydropyranyl groups for 35% of the hydroxyl hydrogen atoms, of which a film exhibited a rate of film thickness reduction of 0.33 nm/second in a 2.38% by weight aqueous solution of tetramethylammonium hydroxide at 23° C.

A semiconductor silicon wafer was uniformly coated with this photoresist solution followed by drying to form a dried photoresist layer having a thickness of 0.7 $\mu$m which exhibited a rate of film thickness reduction of 0.20 nm/second in a 2.38% by weight aqueous solution of tetramethylammonium hydroxide at 23° C. The results of the evaluation tests undertaken for this photoresist composition are shown in Table 1 below.

Comparative Example 1

A positive-working photoresist solution was prepared in the same formulation as in Example 1 excepting for the replacement of the first polyhydroxystyrene resin used in Example 1 with the same amount of a fourth polyhydroxystyrene resin having a weight-average molecular weight of 8000 with a molecular weight dispersion of 1.3 and substituted by tert-butoxycarbonyl groups for 45% of the hydroxyl hydrogen atoms, of which a film exhibited a rate of film thickness reduction of 0.03 nm/second in a 2.38% by weight aqueous solution of tetramethylammonium hydroxide at 23° C., and replacement of the second polyhydroxystyrene resin used in Example 1 with the same amount of a fifth polyhydroxystyrene resin having a weight-average molecular weight of 8000 with a molecular weight dispersion of 1.3 and substituted by 1-ethoxyethyl groups for 45% of the hydroxyl hydrogen atoms, of which a film exhibited a rate of film thickness reduction of 0.03 nm/second in a 2.38% by weight aqueous solution of tetramethylammonium hydroxide at 23° C.

A semiconductor silicon wafer was uniformly coated with this photoresist solution followed by drying to form a dried photoresist layer having a thickness of 0.7 μm which exhibited a rate of film thickness reduction of 0.07 nm/second in a 2.38% by weight aqueous solution of tetramethylammonium hydroxide at 23° C. The results of the evaluation tests undertaken for this photoresist composition are shown in Table 1 below.

Comparative Example 2

A positive-working photoresist solution was prepared in the same formulation as in Example 1 excepting for the replacement of the first polyhydroxystyrene resin used in Example 1 with the same amount of a sixth polyhydroxystyrene resin having a weight-average molecular weight of 8000 with a molecular weight dispersion of 1.3 and substituted by tetrahydropyranyl groups for 45% of the hydroxyl hydrogen atoms, of which a film exhibited a rate of film thickness reduction of 0.03 nm/second in a 2.38% by weight aqueous solution of tetramethylammonium hydroxide at 23° C., and replacement of the second polyhydroxystyrene resin used in Example 1 with the same amount of fifth polyhydroxystyrene resin used in Comparative Example 1.

A semiconductor silicon wafer was uniformly coated with this photoresist solution followed by drying to form a dried photoresist layer having a thickness of 0.7 μm which exhibited a rate of film thickness reduction of 0.03 nm/second in a 2.38% by weight aqueous solution of tetramethylammonium hydroxide at 23° C. The results of the evaluation tests undertaken for this photoresist composition are shown in Table 1 below.

TABLE 1

| | Photo-sensitivity, mJ/cm² | Cross sectional profile of patterned resist layer | Pattern resolution, μm | Number of defects |
| --- | --- | --- | --- | --- |
| Example 1 | 30 | A | 0.18 | 5 |
| Example 2 | 32 | A | 0.18 | 5 |
| Comparative Example 1 | 30 | A | 0.17 | 1200 |
| Comparative Example 2 | 34 | A | 0.17 | 1000 |

EXAMPLE 3

A positive-working photoresist solution was prepared by uniformly dissolving, in 600 parts by weight of propyleneglycol monomethyl ether acetate, 100 parts by weight of a quaternary copolymeric resin consisting of 73.0% by moles of p-hydroxystyrene units, 9.0% by moles of styrene units, 14.0% by moles of 1-ethylcyclohexyl acrylate units and 4.0% by moles of 2,5-dimethylhexanediol diacrylate units and having a weight-average molecular weight of 25000, 3.0 parts by weight of bis(4-tert-butylphenyl)iodonium trifluoromethanesulfonate, 0.150 part by weight of triethanolamine, 0.158 part by weight of phenylphosphonic acid and 0.1 part by weight of a fluorosilicone-based surface active agent (Megafac R-08, a product by Dai-Nippon Ink Chemical Co.) followed by filtration of the solution through a membrane filter of 0.2 μm pore diameter.

A 0.7 μm thick coating layer of this photoresist composition formed on a silicon wafer exhibited a rate of film thickness reduction of 0.10 nm/second in a 2.38% by weight aqueous solution of tetramethylammonium hydroxide at 23° C.

A semiconductor silicon wafer was uniformly coated with this photoresist solution on a spinner followed by heating on a hot plate at 140° C. for 90 seconds to give a dried photoresist layer having a thickness of 0.7 μm which was pattern-wise exposed in stepwise increased exposure doses in the same manner as in the preceding examples and subjected to a post-exposure baking treatment at 140° C. for 90 seconds and a development treatment with a 2.38% by weight aqueous solution of tetramethylammonium hydroxide at 23° C. for 60 seconds followed by rinse with water for 30 seconds and drying to give a patterned resist layer including a hole pattern of 250 nm diameter, of which the cross sectional profile was excellently orthogonal. The minimum exposure dose required for the formation of the hole pattern was 23 mJ/cm².

The number of defects on the wafer detected by using a surface-defect inspection instrument (Model KLA, supra) was 15. Further, the resistance of the resist layer against dry etching was evaluated by measuring the rate of film thickness reduction in a gaseous mixture of carbon tetrafluoride, trifluoromethane and helium as the etching gas to find a value of 9.6 nm/second.

EXAMPLE 4

A positive-working photoresist solution was prepared in the same formulation as in Example 3 described above excepting for the replacement of the quaternary copolymeric resin with the same amount of a second quaternary copolymeric resin consisting of 75.0% by moles of p-hydroxystyrene units, 7.0% by moles of styrene units, 14.0% by moles of 1-ethylcyclohexyl acrylate units and 4.0% by moles of 2,5-dimethylhexanediol diacrylate units and having a weight-average molecular weight of 25000. A dried coating layer of this photoresist composition exhibited a rate of film thickness reduction of 0.25 nm/second in alkali.

The photoresist composition was subjected to the patterning test of the resist layer in the same manner as in Example 3 to give a patterned resist layer with a hole pattern of 250 nm diameter which had an excellently orthogonal cross sectional profile. The minimum exposure dose for the formation of the hole pattern as a measure of the photosensitivity of the photoresist composition was 23.0 mJ/cm². Inspection with the surface-defect inspection instrument (Model KLA, supra) failed to detect any surface defects on the wafer surface. The rate of film thickness reduction as a measure of the etching resistance was 9.6 nm/second as measured in the same manner as in Example 3.

EXAMPLE 5

A positive-working photoresist solution was prepared in the same formulation as in Example 3 described above excepting for the replacement of the quaternary copolymeric resin with the same amount of a third quaternary copolymeric resin consisting of 77.0% by moles of p-hydroxystyrene units, 5.0% by moles of styrene units, 14.0% by moles of 1-ethylcyclohexyl acrylate units and 4.0% by moles of 2,5-dimethylhexanediol diacrylate units and having a weight-average molecular weight of 25000. A dried coating layer of this photoresist composition exhibited a rate of film thickness reduction of 0.42 nm/second in alkali.

The photoresist composition was subjected to the patterning test of the resist layer in the same manner as in Example 3 to give a patterned resist layer with a hole pattern of 250 nm diameter which had a trapezoidal cross sectional profile. The minimum exposure dose for the formation of the hole pattern as a measure of the photosensitivity of the photoresist composition was 23.0 mJ/cm$^2$. The number of surface defects as inspected with the surface-defect inspection instrument (Model KLA, supra) was 5 on the wafer surface. The rate of film thickness reduction as a measure of the etching resistance was 9.6 nm/second as measured in the same manner as in Example 3.

EXAMPLE 6

A positive-working photoresist solution was prepared in the same formulation as in Example 3 described above excepting for the replacement of the quaternary copolymeric resin with the same amount of a ternary copolymeric resin consisting of 72.0% by moles of p-hydroxystyrene units, 3.0% by moles of styrene units and 25.0% by moles of 1-ethylcyclohexyl acrylate units and having a weight-average molecular weight of 15000. A dried coating layer of this photoresist composition exhibited a rate of film thickness reduction of 0.10 nm/second in alkali.

The photoresist composition was subjected to the patterning test of the resist layer in the same manner as in Example 3 to give a patterned resist layer with a hole pattern of 250 nm diameter which had an excellently orthogonal cross sectional profile. The minimum exposure dose for the formation of the hole pattern as a measure of the photosensitivity of the photoresist composition was 25.0 mJ/cm$^2$. The number of surface defects as inspected with the surface-defect inspection instrument (Model KLA, supra) was 15 on the wafer surface. The rate of film thickness reduction as a measure of the etching resistance was 10.0 nm/second as measured in the same manner as in Example 3.

EXAMPLE 7

A positive-working photoresist solution was prepared in the same formulation as in Example 3 described above excepting for the replacement of the quaternary copolymeric resin with the same amount of a binary copolymeric resin consisting of 75.0% by moles of p-hydroxystyrene units and 25.0% by moles of 1-ethylcyclohexyl acrylate units and having a weight-average molecular weight of 15000. A dried coating layer of this photoresist composition exhibited a rate of film thickness reduction of 0.15 nm/second in alkali.

The photoresist composition was subjected to the patterning test of the resist layer in the same manner as in Example 3 to give a patterned resist layer with a hole pattern of 250 nm diameter which had a trapezoidal cross sectional profile. The minimum exposure dose for the formation of the hole pattern as a measure of the photosensitivity of the photoresist composition was 25.0 mJ/cm$^2$. The number of surface defects as inspected with the surface-defect inspection instrument (Model KLA, supra) was 20 on the wafer surface. The rate of film thickness reduction as a measure of the etching resistance was 10.0 nm/second as measured in the same manner as in Example 3.

Comparative Example 3

A positive-working photoresist solution was prepared in the same formulation as in Example 3 described above excepting for the replacement of the quaternary copolymeric resin with the same amount of a fourth quaternary copolymeric resin consisting of 71.0% by moles of p-hydroxystyrene units, 11.0% by moles of styrene units, 14.0% by moles of 1-ethylcyclohexyl acrylate units and 4.0% by moles of 2,5-dimethylhexanediol diacrylate units and having a weight-average molecular weight of 25000. A dried coating layer of this photoresist composition exhibited a rate of film thickness reduction of 0.05 nm/second in alkali.

The photoresist composition was subjected to the patterning test of the resist layer in the same manner as in Example 3 to give a patterned resist layer with a hole pattern of 250 nm diameter which had an excellent cross sectional profile. The minimum exposure dose for the formation of the hole pattern as a measure of the photosensitivity of the photoresist composition was 23.0 mJ/cm$^2$. The number of surface defects as inspected with the surface-defect inspection instrument (Model KLA, supra) was 500 on the wafer surface. The rate of film thickness reduction as a measure of the etching resistance was 9.6 nm/second as measured in the same manner as in Example 3.

Comparative Example 4

A positive-working photoresist solution was prepared in the same formulation as in Example 3 described above excepting for the replacement of the quaternary copolymeric resin with the same amount of a ternary copolymeric resin consisting of 66.0% by moles of p-hydroxystyrene units, 9.0% by moles of styrene units and 25.0% by moles of 1-ethylcyclohexyl acrylate units and having a weight-average molecular weight of 15000. A dried coating layer of this photoresist composition exhibited a rate of film thickness reduction of 0.02 nm/second in alkali.

The photoresist composition was subjected to the patterning test of the resist layer in the same manner as in Example 3 to give a patterned resist layer with a hole pattern of 250 nm diameter which had an excellent cross sectional profile. The minimum exposure dose for the formation of the hole pattern as a measure of the photosensitivity of the photoresist composition was 25.0 mJ/cm$^2$. The number of surface defects as inspected with the surface-defect inspection instrument (Model KLA, supra) was 7000 on the wafer surface. The rate of film thickness reduction as a measure of the etching resistance was 10.0 nm/second as measured in the same manner as in Example 3.

What is claimed is:

1. In a method for the preparation of a semiconductor device by forming a patterned resist layer on the surface of a substrate by pattern-wise light-exposure of a photoresist layer of a chemical-amplification positive-working photoresist composition comprising (A) a compound capable of generating an acid by irradiation with actinic rays and (B) a resinous compound capable of being imparted with increased solubility in an aqueous alkaline solution in the presence of an acid, the improvement which comprises decreasing the number of defects in the patterned resist layer by using a photoresist composition of which a layer before the pattern-wise light-exposure exhibits reduction of thickness at 23° C. in a 2.38% by weight aqueous solution of tetramethylammonium hydroxide at a rate in the range from 0.15 to 0.20 nm/second.

2. The improvement as claimed in claim 1 in which the resinous compound as the component (B) of the photoresist composition is a copolymeric resin (B-1) comprising monomeric units of hydroxystyrene or α-methyl hydroxystyrene substituted by acid-dissociable groups for the hydrogen atoms of the hydroxyl groups and monomeric units of hydroxystyrene or α-methyl hydroxystyrene.

3. The improvement as claimed in claim 2 in which the acid-dissociable group is selected from the group consisting of tertiary alkyloxycarbonyl groups, tertiary alkyloxycarbonylalkyl groups, tertiary alkyl groups, cyclic ether groups and alkoxyalkyl groups.

4. The improvement as claimed in claim 3 in which the acid-dissociable group is selected from the group consisting of tert-butyloxycarbonyl group, tert-butyloxycarbonylmethyl group, tert-butyl group, tetrahydropyranyl group, tetrahydrofuranyl group, 1-ethoxyethyl group and 1-methoxypropyl group.

5. The improvement as claimed in claim 2 in which the molar fraction of the monomeric units of hydroxystyrene or α-methyl hydroxystyrene substituted by acid-dissociable groups for the hydrogen atoms of the hydroxyl groups in the copolymeric resin (B-1) is in the range from 10 to 60%.

6. The improvement as claimed in claim 1 in which the component (B) is a combination of a first resinous compound ($B_1$) which is a polyhydroxystyrene having a weight-average molecular weight of 3000 to 30000 with a molecular weight dispersion of 1 to 6.0 and substituted by tert-butyloxycarbonyl groups or tetrahydropyranyl groups for 10 to 50% of the hydrogen atoms of the hydroxyl groups and a second resinous compound ($B_2$) which is a polyhydroxystyrene having a weight-average molecular weight of 3000 to 30000 with a molecular weight dispersion of 1 to 6.0 and substituted by alkoxyalkyl groups for 10 to 50% of the hydrogen atoms of the hydroxyl groups.

7. The improvement as claimed in claim 6 in which the weight proportion of the first resinous compound ($B_1$) and the second resinous compound ($B_2$) is in the range from 10:90 to 90:10.

* * * * *